(12) United States Patent
Tan

(10) Patent No.: US 11,811,406 B2
(45) Date of Patent: Nov. 7, 2023

(54) DRIVING DEVICE AND DRIVING-PROGRAM UPDATING METHOD FOR FAN

(71) Applicant: Midastek Microelectronics Inc., Taipei (TW)

(72) Inventor: Chung-Ping Tan, Taipei (TW)

(73) Assignee: Midastek Microelectronics Inc., Taipei (TW)

( * ) Notice: Subject to any disclaimer, the term of this patent is extended or adjusted under 35 U.S.C. 154(b) by 117 days.

(21) Appl. No.: 17/482,428

(22) Filed: Sep. 23, 2021

(65) Prior Publication Data

US 2023/0062609 A1 Mar. 2, 2023

(30) Foreign Application Priority Data

Aug. 30, 2021 (TW) .................. 110132149

(51) Int. Cl.
*H03K 3/017* (2006.01)
*G05B 19/042* (2006.01)

(52) U.S. Cl.
CPC ......... *H03K 3/017* (2013.01); *G05B 19/0426* (2013.01); *G05B 2219/23296* (2013.01)

(58) Field of Classification Search
None
See application file for complete search history.

(56) References Cited

U.S. PATENT DOCUMENTS

| | | | | |
|---|---|---|---|---|
| 9,534,612 B2* | 1/2017 | Wu | ........................ | F04D 27/001 |
| 9,547,299 B2* | 1/2017 | Chen | ...................... | H05B 47/19 |
| 10,440,857 B2* | 10/2019 | Lee | .......................... | H03K 5/26 |
| 2019/0103771 A1* | 4/2019 | Piasecki | .................. | H02J 50/10 |
| 2021/0109588 A1* | 4/2021 | Wang | ................... | F04D 19/002 |

* cited by examiner

*Primary Examiner* — Thomas J. Hiltunen
*Assistant Examiner* — Khareem E Almo
(74) *Attorney, Agent, or Firm* — JCIPRNET

(57) ABSTRACT

A driving device and a driving-program updating method are provided. The driving device includes a signal converter, a storage circuit, a controller, a driver, and a detection circuit. The signal converter receives a first signal and converts the first signal into a second signal. The storage circuit stores a driving program. The controller provides a control signal in response to the second signal and the driving program. The driver drives a fan unit in response to the control signal. The detection circuit detects whether the first signal includes a program update command. When the first signal includes the program update command, the detection circuit updates the driving program stored in the storage circuit based on the program update command.

10 Claims, 5 Drawing Sheets

DRIVING DEVICE AND DRIVING-PROGRAM UPDATING METHOD FOR FAN

CROSS-REFERENCE TO RELATED APPLICATION

This application claims the priority benefit of Taiwan application serial no. 110132149, filed on Aug. 30, 2021. The entirety of the above-mentioned patent application is hereby incorporated by reference herein and made a part of this specification.

BACKGROUND

Technical Field

The disclosure relates to a driving device and a driving-program updating method, particularly to a driving device and a driving-program updating method for a fan unit.

Description of Related Art

The current fan device operates based on the driving program and the input signals. The fan device can determine the speed or the operating mode of the fan based on the driving program and the frequency or voltage value of the input signal. However, when the driving program is determined to be wrong or not suitable for the fan device, the current practice is to replace the storage component that stores the driving program. For example, the storage component of the storage driving program may be unsoldered and replaced with a new storage component. And such approach is relatively time and cost consuming.

SUMMARY

The disclosure provides a driving device and a driving-program updating method for a fan unit that update a driving program.

The driving device of the present disclosure is adapted to drive a fan unit. The driving device includes a signal converter, a storage circuit, a controller, a driver, and a detection circuit. The signal converter receives a first signal and converts the first signal into a second signal. The storage circuit stores a driving program. The controller is coupled to the signal converter and the storage circuit. In response to the second signal and the driving program, the controller provides a control signal. The driver is coupled to the controller. The driver drives the fan unit in response to the control signal. The detection circuit is coupled to the storage circuit. The detection circuit detects whether the first signal includes a program update command. When the first signal includes the program update command, the detection circuit updates the driving program stored in the storage circuit based on the program update command.

The driving-program updating method for a fan unit of the present disclosure includes: receiving a first signal, and converting the first signal into a second signal; providing a control signal in response to the second signal and a driving program to drive the fan unit; detecting whether the first signal includes a program update command; and when the first signal includes the program update command, updating the driving program based on the program update command.

Based on the above, when the first signal includes a program update command, the driving device and the driving-program updating method of the present disclosure update the driving program based on the program update command. Therefore, the present disclosure provides a driving-program update mechanism that may significantly reduce the time and cost spent on modifying the driving program. In addition, as the second signal and the program update command are both derived from the first signal, the present disclosure does not need to add pins to update the driving program.

In order to make the features and advantages of the present disclosure more comprehensible, the following embodiments are described in detail in conjunction with the drawings.

DESCRIPTION OF THE EMBODIMENTS

Part of the embodiments of the present disclosure is described in detail below in conjunction with the drawings. The reference symbols used in the following description can be regarded as the same or similar components when the same reference symbols appear in different drawings. These embodiments represent only a part of the disclosure, and cannot disclose all the possible implementations of the present disclosure. To put it more precisely, these embodiments are only some of the examples of the claims of the patent disclosure.

Figure 1:
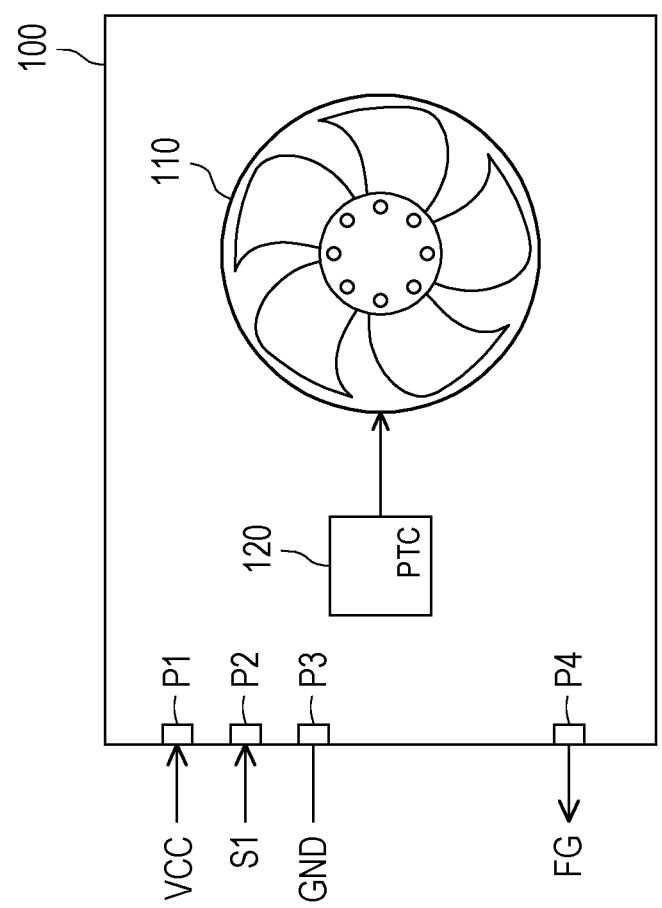
FIG. 1 is a schematic diagram of a fan device according to an embodiment of the present disclosure.

Please refer to FIG. 1, which is a schematic diagram of a fan device according to an embodiment of the present disclosure. In this embodiment, a fan device 100 includes a fan unit 110 and a driving device 120. The driving device 120 is adapted to drive the fan unit 110. The fan device 100 has pins P1 to P4. The pin P1 is adapted to receive a power supply VCC. The pin P2 is adapted to receive a first signal S1. The pin P3 is adapted to connect to a ground GND. And the pin P4 is adapted to output the signal FG. The pin P4 is generally called the FG pin. It should be noted that compared with the current fan device, the number of pins of the fan device 100 has not been increased.

In this embodiment, the driving device 120 operates using the power supply VCC, and drives the fan unit 110 based on the first signal S1 and a driving program PTC. In addition, when the first signal S1 includes a program update command, the driving device 120 updates the driving program PTC based on the program update command.

Figure 2:
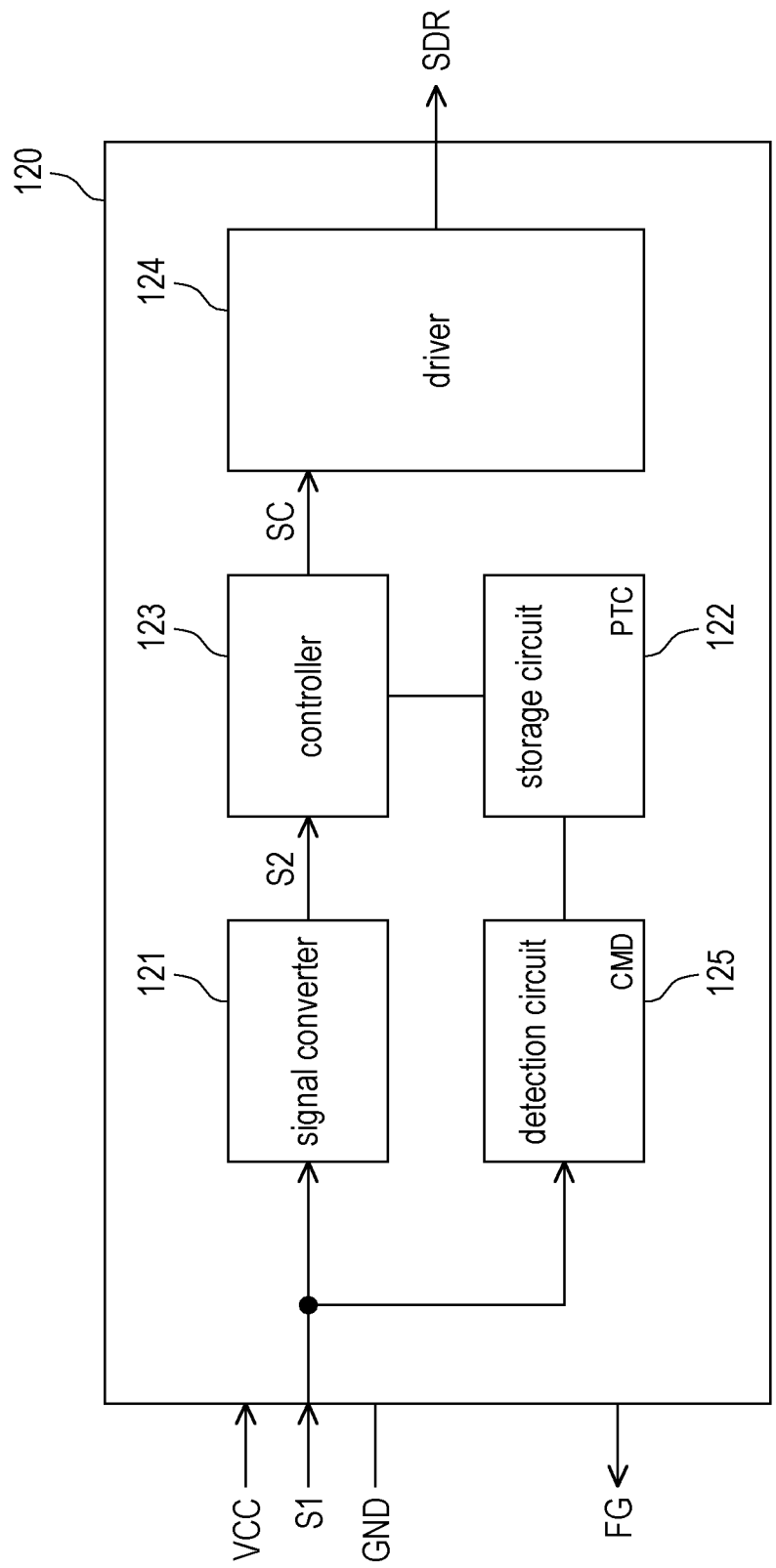
FIG. 2 is a schematic diagram of the driving device shown in FIG. 1.

For further explanation, please refer to FIG. 1 and FIG. 2. FIG. 2 is a schematic diagram of the driving device according to the first embodiment of the present disclosure. In this embodiment, the driving device 120 includes a signal converter 121, a storage circuit 122, a controller 123, a driver 124, and a detection circuit 125. The signal converter 121 receives the first signal S1 and converts the first signal S1 into a second signal S2. The storage circuit 122 stores the driving program PTC. The controller 123 is coupled to the signal converter 121 and the storage circuit 122. The controller 123 receives the second signal S2 and the driving program PTC. The controller 123 provides the control signal SC in response to the second signal S2 and the driving program PTC. The driving program PTC generates the control signal SC according to the waveform of the second signal S2. The driving program PTC may be different depending on different fan devices 100. For example, the driving program PTC may be different depending on different man-machine control interfaces. For another example, the driving program PTC may be different depending on different fan units 110.

In this embodiment, the first signal S1 is a pulse-width modulation (PWM) signal with a frequency range. The second signal S2 is a voltage signal. The voltage value of the second signal S2 is related to the frequency in the aforementioned frequency range. For example, the voltage value of the second signal S2 and the frequency of the first signal S1 have a positive correlation; or, the voltage value of the second signal S2 and the rotation speed of the fan unit 110 have a positive correlation. It should be noted that the first signal S1 is a high-speed, high-accuracy digital signal that achieves high-precision rotational speed, whereas the second signal S2 is a voltage analog signal that has a good anti-noise effect. Therefore, the driving device 120 has the effects of driving-program updates, high-precision control, and good environmental-noise reduction.

In this embodiment, the driver 124 is coupled to the controller 123. The driving program PTC can be software or firmware, for example. The driver 124 drives the fan unit 110 in response to the control signal SC provided by the controller 123. Furthermore, the driver 124 outputs the driving power SDR in response to the control signal SC, and drives the fan unit 110 using the driving power SDR.

In this embodiment, the detection circuit 125 is coupled to the storage circuit 122. The detection circuit 125 detects the composition of the first signal S1. The detection circuit 125 detects whether the first signal S1 includes a program update command CMD. When the first signal S1 includes the program update command CMD, the detection circuit 125 updates the driving program PTC stored in the storage circuit 122 based on the program update command CMD. In contrast, when the first signal S1 does not include the program update command CMD, the detection circuit 125 does not update the driving program PTC stored in the storage circuit 122.

It is worth mentioning here that, when the first signal S1 includes the program update command CMD, the driving device 120 updates the driving program PTC based on the program update command CMD. Therefore, when the driving program PTC is not suitable for the fan device 100, when the driving program PTC needs to be optimized, or when the driving program PTC is damaged, the driving device 120 may update the driving program PTC based on the program update command CMD. In this way, the time and cost spent on updating the driving program PTC may be reduced significantly. In addition, since the second signal S2 and the program update command PTC are both derived from the first signal S1, the driving device 120 may update the driving program PTC through only the pin P2. In this way, additional pins do not need to be added to the driving device 120 to update the driving program PTC.

In this embodiment, the frequency of the program update command CMD is greater than the maximum frequency in the frequency range of the first signal S1. For example, the frequency of the program update command CMD is approximately several megahertz (MHz), and the maximum frequency of the first signal S1 is approximately several kilohertz (kHz). Therefore, the first signal S1 including the program update command CMD may be regarded as the first signal S1 carrying the program update command CMD with a higher frequency. The detection circuit 125 may identify whether the first signal S1 carries the program update command CMD based on the frequency. When the first signal S1 carries the frequency of the program update command CMD (several megahertz (MHz)), the detection circuit 125 detects that the first signal S1 includes the program update command CMD and updates the driving program PTC stored in the storage circuit 122.

In this embodiment, the program update command CMD includes a storage address and an updating code. The update code is the data corresponding to the new driving program PTC. Therefore, the detection circuit 125 may store the new driving program PTC to the designated address of the storage circuit 122 based on the storage address and the update code.

In this embodiment, the storage circuit 122 may be any type of storage medium. The controller 123 and the detection circuit 125 are each, for example, a programmable general-purpose or special-purpose microprocessor, a digital signal processor (DSP), a programmable controller, and application specific integrated circuits (ASIC), a programmable logic device (PLD), other similar devices, or a combination of these devices, which can load and execute computer programs. The driver 124 is, for example, a gate driver composed of a plurality of power transistors. The upper arm power transistors of the above power transistors may be N-type power transistors or P-type power transistors in any forms, such as a metal-oxide-semiconductor field-effect transistor (MOSFET) or an insulated gate bipolar transistor (IGBT). The lower arm power transistors of the above power transistors may be N-type power transistors in any forms.

Figure 3:
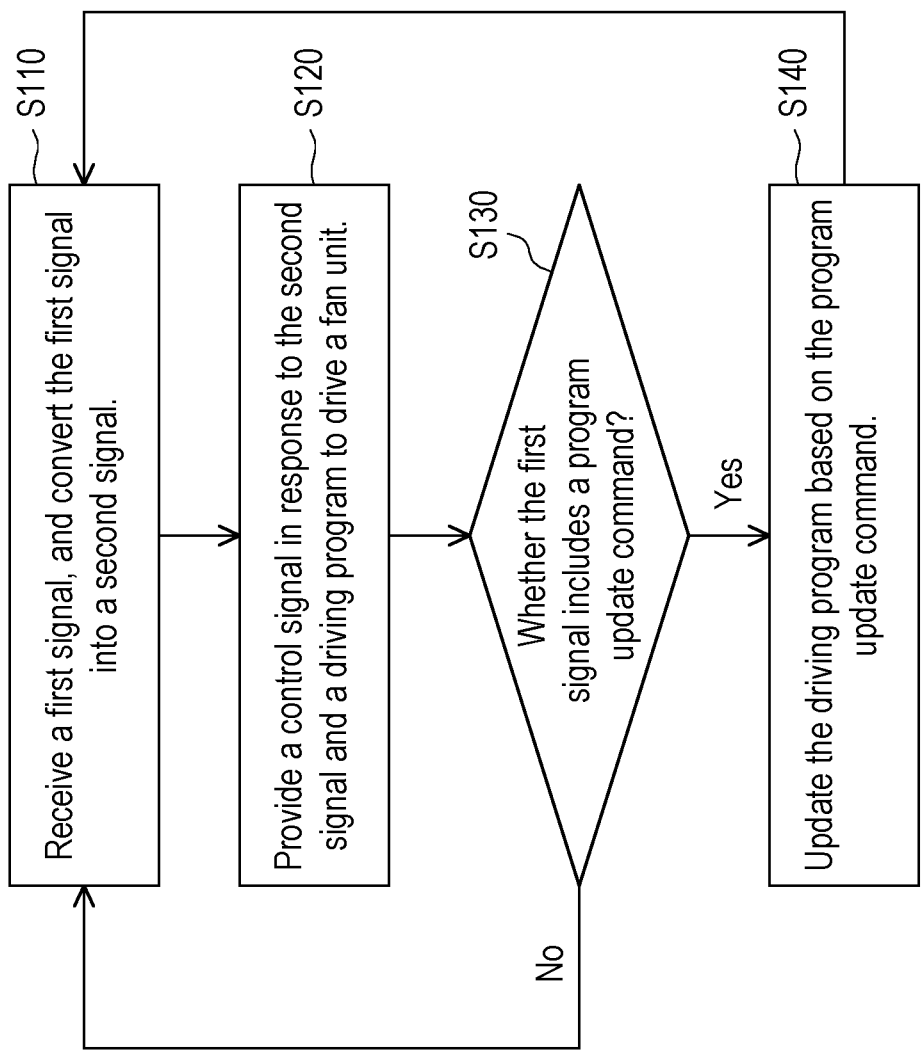
FIG. 3 is a method flowchart of a driving-program updating method according to an embodiment of the present disclosure.

Please refer to FIG. 1 and FIG. 3 at the same time. FIG. 3 is a flowchart of a driving-program updating method according to an embodiment of the present disclosure. The driving-program updating method may be applied to the driving device 120 in this embodiment. In step S110, a driving device 120 receives a first signal S1 and converts the first signal S1 into a second signal S2. In step S120, the driving device 120 provides a control signal SC in response to the second signal S2 and a driving program PTC, and drives a fan unit 110 based on the control signal SC. In step S130, the driving device 120 detects whether the first signal S1 includes a program update command CMD. When the first signal S1 includes the program update command CMD, the driving device 120 updates the driving program PTC based on the program update command CMD in step S140, and then the driving-program updating method returns to step S110. In contrast, when it is detected that the first signal S1 does not include the program update command CMD in step S130, the driving-program updating method returns to step S110. As the implementation details of steps S110 to S140 in this embodiment can be sufficiently taught by the embodiments of FIG. 1 and FIG. 2, the same is not repeated here.

Figure 4:
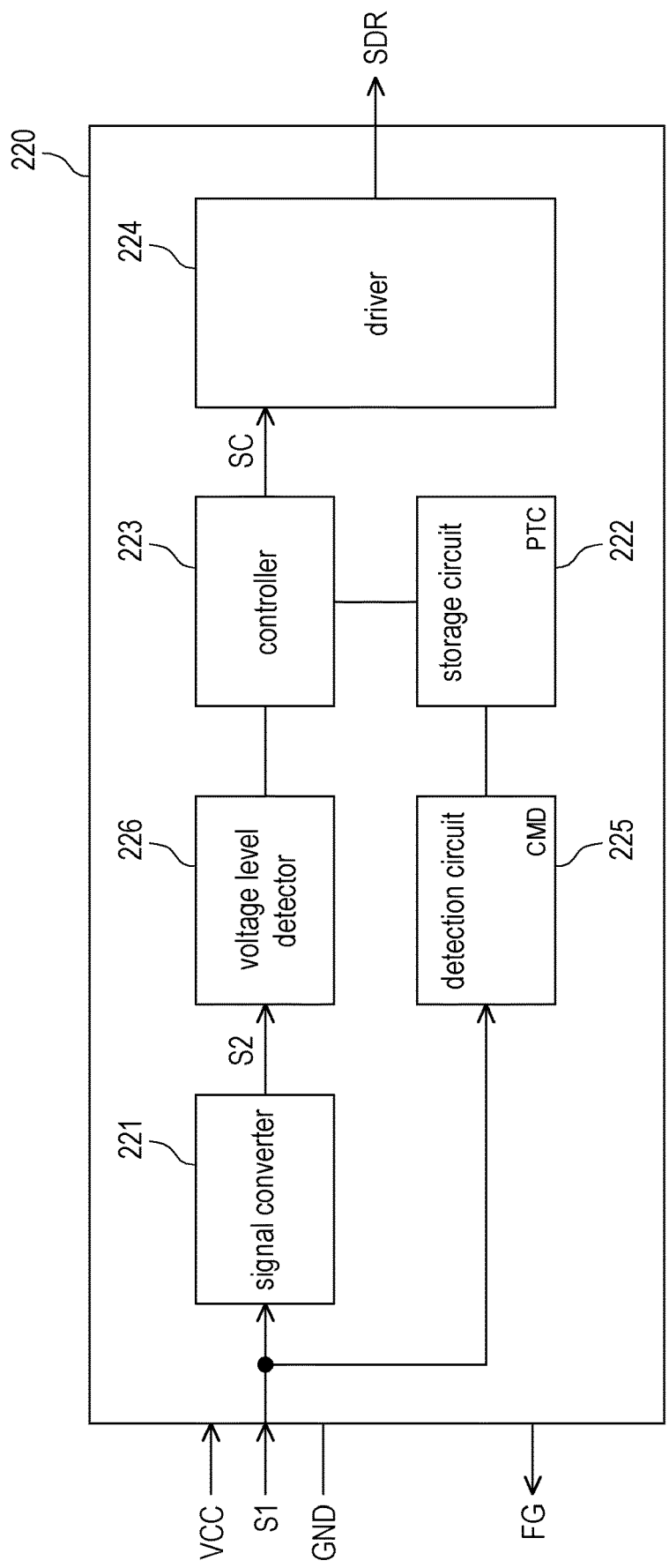
FIG. 4 is a schematic diagram of a driving device according to another embodiment of the present disclosure.

Please refer to FIG. 4, which is a schematic diagram of a driving device according to another embodiment of the present disclosure. In this embodiment, a driving device 220 includes a signal converter 221, a storage circuit 222, a controller 223, a driver 224, a detection circuit 225, and a voltage level detector 226. The collaborative operation of the signal converter 221, the storage circuit 222, the controller 223, the driver 224, and the detection circuit 225 is similar to the collaborative operation of the signal converter 121, the storage circuit 122, the controller 123, the driver 124, and the detection circuit 125 shown in FIG. 2. In this embodiment, the voltage level detector 226 is coupled to the signal converter 221 and the controller 223. The voltage level detector 226 receives the second signal S2 from the signal converter 221, and detects whether the voltage value of the second signal S2 falls outside the preset voltage-value range. When the voltage value of the second signal S2 is detected to be outside the preset voltage-value range, it means that the voltage value of the second signal S2 is not suitable for driving the fan unit (e.g., the fan unit 110 shown in FIG. 1). Therefore, the voltage level detector 226 instructs the controller 223 to stop providing the control signal SC. In contrast, when the voltage value of the second signal S2 is detected to be within the preset voltage-value range, it means that the voltage value of the second signal S2 is suitable for driving the fan unit, and the voltage level detector 226 instructs the controller 223 to provide the control signal SC.

Figure 5:
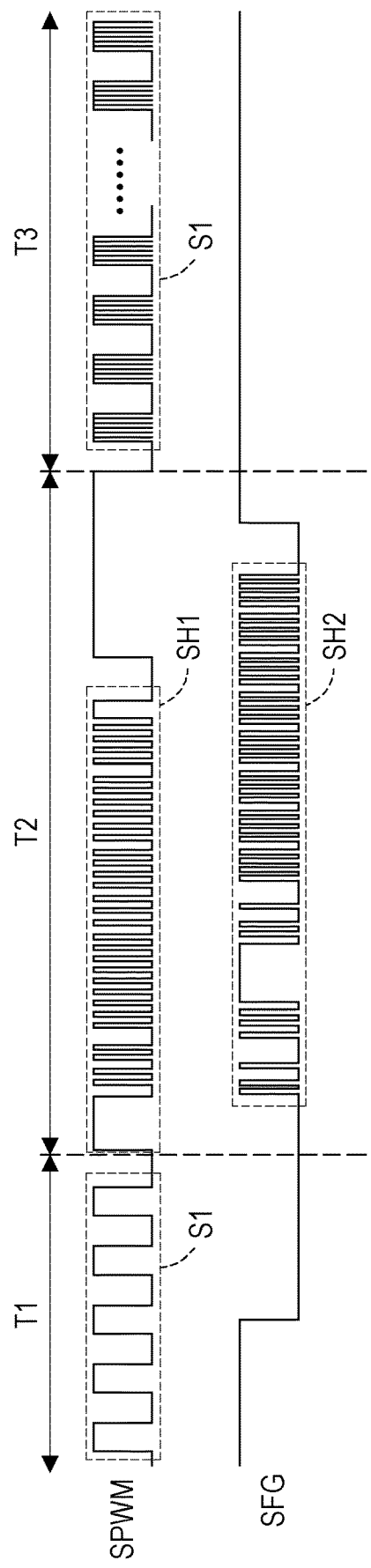
FIG. 5 is a timing diagram of signals at pins P2 and P4 according to an embodiment of the present disclosure.

Please refer to FIG. 1, FIG. 2, and FIG. 5 at the same time. FIG. 5 is a timing diagram of signals at pins P2 and P4 according to an embodiment of the present disclosure. In this embodiment, a driving device 120 performs a handshake with an external device (not shown). In this embodiment, the timing SPWM is the timing at the pin P2, and the timing SFG is the timing at the pin P4. In the time interval T1, a signal converter 121 receives a first signal S1 provided by the external device through the pin P2, and converts the first signal S1 into a second signal S2. A detection circuit 125 detects that the first signal S1 does not include a program update command CMD, and thus the driving program PTC stored in the storage circuit 122 is not updated. A controller 123 provides a control signal SC in response to the second signal S2 and the driving program PTC, and a driver 124 drives the fan unit 110 in response to the control signal SC provided by the controller 123.

In the time interval T2, the signal converter 121 starts to receive a first communication signal SH1 provided by the external device through the pin P2. After the controller 123 identifies at least part of the first communication signal SH1 (for example, the header of the first communication signal SH1), it generates a second communication signal SH2. Next, the controller 123 outputs the second communication signal SH2 to the external device through the pin P4. Therefore, the driving device 120 and the external device communicate with each other through a handshake. The first communication number SH1 includes, for example, a notification signal that the external device provides a program update command CMD, and the second communication signal SH2 includes, for example, a status signal that indicates the driving device 120 is ready.

In the time interval T3, after the communication is completed, the external device provides the first signal S1 including the program update command CMD. As the detection circuit 125 detects that the first signal S1 includes a program update command CMD, the driving program PTC stored in the storage circuit 122 is updated.

In summary, when the first signal includes a program update command, the driving device and the driving-program updating method of the present disclosure update the stored driving program based on the program update command. In this way, the driving-program update mechanism provided by the present disclosure does not need to replace the storage component that stores the driving program, so that the time and cost spent on modifying the driving program may be reduced significantly. Furthermore, as the second signal and the program update command are both derived from the first signal, in the present disclosure, additional pins do not need to be added to update the driving program. And since the first signal is a high-speed, high-accuracy digital signal that achieves high-precision rotational speed and the second signal is a voltage analog signal that has a good anti-noise effect, the driving device of the preset disclosure has the benefit of driving-program updates, high-precision control, and good environmental-noise reduction.

Although the present disclosure has been disclosed in the embodiments above, it is not intended to limit the present disclosure. Anyone skilled in the art can make changes and modifications without departing from the spirit and scope of the present disclosure. The scope of protection of the present disclosure shall be subject to those defined by the claims attached.

What is claimed is:

1. A driving device for a fan unit, the driving device comprising:
   a signal converter, configured to receive a first signal and convert the first signal into a second signal;
   a storage circuit, configured to store a driving program;
   a controller, coupled to the signal converter and the storage circuit, and configured to provide a control signal in response to the second signal and the driving program;
   a driver, coupled to the controller, configured to drive the fan unit in response to the control signal; and
   a detection circuit, coupled to the storage circuit, configured to detect whether the first signal comprises a program update command, wherein: when the first signal comprises the program update command, the driving program stored in the storage circuit is updated based on the program update command,
   wherein the first signal is a pulse-width modulation signal with a frequency range,
   wherein the second signal is a voltage signal, and
   wherein a voltage value of the second signal is related to a first frequency of the frequency range.

2. The driving device according to claim 1, wherein:
   a second frequency of the program update command is greater than a maximum frequency in the frequency range; and
   when the first signal carries the second frequency, the detection circuit detects that the first signal comprises the program update command and updates the driving program stored in the storage circuit.

3. The driving device according to claim 1, further comprising:
   a voltage level detector, coupled to the signal converter and the controller, configured to receive the second signal and detect whether the voltage value of the second signal falls outside a preset voltage-value range,
   wherein when the voltage value of the second signal falls outside the preset voltage-value range, the voltage level detector instructs the controller to stop providing the control signal.

4. The driving device according to claim 3, wherein when the voltage value of the second signal falls within the preset voltage-value range, the voltage level detector instructs the controller to provide the control signal.

5. The driving device according to claim 1, wherein the controller receives a first communication signal from an external device, and provides a second communication signal to the external device based on at least part of the first communication signal to notify the external device to provide the first signal comprising the program update command.

6. A driving-program updating method for a fan unit, the driving-program updating method comprising:
  receiving a first signal, and converting the first signal into a second signal;
  providing a control signal in response to the second signal and a driving program to drive the fan unit;
  detecting whether the first signal comprises a program update command; and
  when the first signal comprises the program update command, updating the driving program based on the program update command,
  wherein the first signal is a pulse-width modulation signal with a frequency range,
  wherein the second signal is a voltage signal, and
  wherein a voltage value of the second signal is related to a first frequency of the frequency range.

7. The driving-program updating method according to claim 6, wherein:
  a second frequency of the program update command is greater than a maximum frequency in the frequency range; and
  when the first signal comprises the program update command, updating the driving program based on the program update command comprises:
    when the first signal carries the second frequency, detecting that the first signal comprises the program update command, and updating the stored driving program.

8. The driving-program updating method according to claim 6, further comprising:
  detecting whether the voltage value of the second signal falls outside a preset voltage-value range; and
  when the voltage value of the second signal falls outside the preset voltage-value range, stopping providing the control signal.

9. The driving-program updating method according to claim 8, further comprising:
  when the voltage value of the second signal falls within the preset voltage-value range, providing the control signal.

10. The driving-program updating method according to claim 6, further comprising:
  receiving the first communication signal from the external device;
  based on at least part of the first communication signal, providing a second communication signal to the external device to notify the external device to provide the first signal comprising the program update command.

* * * * *